(12) United States Patent
Rofougaran

(10) Patent No.: US 7,978,782 B2
(45) Date of Patent: Jul. 12, 2011

(54) METHOD AND SYSTEM FOR POLAR MODULATION USING A DIRECT DIGITAL FREQUENCY SYNTHESIZER

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1003 days.

(21) Appl. No.: 11/680,044

(22) Filed: Feb. 28, 2007

(65) Prior Publication Data
US 2008/0205541 A1 Aug. 28, 2008

(51) Int. Cl.
H03K 7/06 (2006.01)
(52) U.S. Cl. ........ 375/271; 375/265; 375/269; 455/313; 348/725
(58) Field of Classification Search .................. 375/265, 375/269; 455/313; 348/725
See application file for complete search history.

(56) References Cited

U.S. PATENT DOCUMENTS

| | | | | |
|---|---|---|---|---|
| 6,163,259 A * | 12/2000 | Barsumian et al. | ........ | 340/572.2 |
| 6,344,871 B1 * | 2/2002 | Liu et al. | ........... | 348/21 |
| 6,359,506 B1 * | 3/2002 | Camp et al. | ........... | 330/124 R |
| 6,483,388 B2 * | 11/2002 | Khan | ............... | 331/18 |
| 6,794,937 B1 * | 9/2004 | Timaru et al. | ........... | 330/149 |
| 7,123,664 B2 * | 10/2006 | Matero | ............ | 375/295 |
| 7,130,287 B2 * | 10/2006 | Nounin et al. | ........... | 370/332 |
| 7,161,613 B2 * | 1/2007 | Liu et al. | ........... | 348/21 |
| 7,224,302 B2 * | 5/2007 | Dornbusch | ........... | 341/143 |
| 7,236,542 B2 * | 6/2007 | Matero | ........... | 375/295 |
| 7,324,789 B2 * | 1/2008 | Jensen | ........... | 455/76 |
| 7,358,885 B2 * | 4/2008 | Maxim et al. | ........... | 341/144 |
| 7,363,014 B2 * | 4/2008 | Nakamura et al. | ........ | 455/127.3 |
| 7,421,037 B2 * | 9/2008 | Shakeshaft et al. | ........ | 375/295 |
| 7,424,064 B2 * | 9/2008 | Shakeshaft et al. | ........ | 375/295 |
| 7,425,995 B2 * | 9/2008 | Johnson | ........... | 348/725 |
| 7,447,493 B2 * | 11/2008 | Johnson | ........... | 455/334 |
| 7,515,652 B2 * | 4/2009 | Jensen | ........... | 375/308 |
| 7,580,964 B2 * | 8/2009 | Merlo et al. | ........... | 708/276 |
| 7,599,676 B2 * | 10/2009 | Maxim | ........... | 455/258 |
| 2003/0227342 A1 * | 12/2003 | Liu | ........... | 332/145 |
| 2004/0017858 A1 * | 1/2004 | Rozenblit et al. | ........... | 375/295 |
| 2004/0185781 A1 * | 9/2004 | Moloudi | ........... | 455/63.1 |
| 2005/0266818 A1 * | 12/2005 | Johnson et al. | ........... | 455/260 |
| 2006/0025099 A1 * | 2/2006 | Jung et al. | ........... | 455/313 |
| 2007/0019757 A1 * | 1/2007 | Matero | ........... | 375/297 |
| 2007/0027943 A1 * | 2/2007 | Jensen et al. | ........... | 708/300 |
| 2007/0076783 A1 * | 4/2007 | Dishman et al. | ........... | 375/136 |
| 2007/0174371 A1 * | 7/2007 | Merlo et al. | ........... | 708/200 |
| 2007/0290749 A1 * | 12/2007 | Woo et al. | ........... | 330/149 |
| 2008/0123777 A1 * | 5/2008 | Trager et al. | ........... | 375/316 |
| 2008/0130800 A1 * | 6/2008 | Maxim et al. | ........... | 375/345 |

(Continued)

*Primary Examiner* — Chieh M Fan
*Assistant Examiner* — Santiago Garcia
(74) *Attorney, Agent, or Firm* — McAndrews, Held & Malloy, Ltd.

(57) ABSTRACT

Methods and systems for polar modulation using a digital direct frequency synthesizer (DDFS) are disclosed and may comprise generating a phase modulated signal in a DDFS, amplitude modulating the generated phase modulated signal in a non-linear device and transmitting the signal via a wireless medium. A processor may control the generation of the phase and amplitude modulated signals. The non-linear device may comprise a non-linear power amplifier or a mixer. The method may also comprise generating a first phase modulated signal in a first DDFS and generating a second phase modulated signal in a second DDFS, or in a single DDFS with two integrated digital-to-analog converters, and upconverting and combining the first and second phase modulated signals and amplitude modulating the combined upconverted signals in a non-linear device. A processor may be enabled to control the generation of the first and second phase modulated signals.

30 Claims, 7 Drawing Sheets

U.S. PATENT DOCUMENTS

| | | | |
|---|---|---|---|
| 2008/0132189 A1* | 6/2008 | Maxim et al. | 455/280 |
| 2008/0143594 A1* | 6/2008 | Wang et al. | 342/357.12 |
| 2008/0180579 A1* | 7/2008 | Maxim | 348/735 |
| 2008/0181337 A1* | 7/2008 | Maxim | 375/340 |
| 2008/0181340 A1* | 7/2008 | Maxim | 375/346 |
| 2008/0205541 A1* | 8/2008 | Rofougaran | 375/269 |
| 2008/0205542 A1* | 8/2008 | Rofougaran | 375/271 |
| 2008/0205543 A1* | 8/2008 | Rofougaran | 375/271 |
| 2008/0205549 A1* | 8/2008 | Rofougaran | 375/299 |
| 2008/0207139 A1* | 8/2008 | Rofougaran | 455/91 |
| 2008/0233871 A1* | 9/2008 | Rofougaran et al. | 455/41.2 |
| 2008/0233873 A1* | 9/2008 | Rofougaran et al. | 455/41.2 |
| 2009/0067541 A1* | 3/2009 | Byun et al. | 375/297 |
| 2009/0080541 A1* | 3/2009 | Rofougaran | 375/259 |
| 2009/0081985 A1* | 3/2009 | Rofougaran et al. | 455/326 |
| 2009/0134918 A1* | 5/2009 | Tzeng | 327/106 |

* cited by examiner

METHOD AND SYSTEM FOR POLAR MODULATION USING A DIRECT DIGITAL FREQUENCY SYNTHESIZER

CROSS-REFERENCE TO RELATED APPLICATIONS/INCORPORATION BY REFERENCE

This application makes reference to:
U.S. application Ser. No. 11/680,236 filed on even date herewith;
U.S. application Ser. No. 11/680,165 filed on even date herewith;
U.S. application Ser. No. 11/680,176 filed on even date herewith;
U.S. application Ser. No. 11/680,188 filed on even date herewith;
U.S. application Ser. No. 11/680,253 filed on even date herewith; and
U.S. application Ser. No. 11/680,370 filed on even date herewith.

Each of the above stated applications is hereby incorporated by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to RF transmitters. More specifically, certain embodiments of the invention relate to a method and system for polar modulation using a direct digital frequency synthesizer.

BACKGROUND OF THE INVENTION

A Direct Digital Frequency Synthesizer (DDFS) is a digitally-controlled signal generator that may vary the output signal frequency over a large range of frequencies, based on a single fixed-frequency precision reference clock. In addition, a DDFS is also phase-tunable. In essence, within the DDFS, discrete amplitude levels are fed to a Digital-to-Analog Converter (DAC) at a sampling rate determined by the fixed-frequency reference clock. The output of the DDFS provides a signal whose shape depends on the sequence of discrete amplitude levels that are fed to the DAC at the constant sampling rate. The DDFS is particularly well suited as a frequency generator that outputs a sine or other periodic waveforms over a large range of frequencies, from almost DC to approximately half the fixed-frequency reference clock frequency.

A DDFS offers a larger range of operating frequencies and requires no feedback loop, thereby providing near instantaneous phase- and frequency changes, avoiding over- and undershooting and settling time issues associated with another analog systems. A DDFS may provide precise digitally-controlled frequency and/or phase changes without signal discontinuities.

Polar Modulation is related to inphase (I) and quadrature (Q) modulation in the same way that polar coordinates are related to the Cartesian coordinate system. For polar modulation, the orthogonal I and Q components of an RF signal are converted to a phasor representation comprising an amplitude component and a phase component. In this way, the combined I and Q signal may be generated with one phase change and one amplitude change, whereas separate I and Q modulation may require amplitude and phase modulation for each channel, especially for non-constant envelope modulation modes. In addition, the I and Q modulation approach may require good linearity of the power amplifier, often leading to power inefficient designs that suffer from parameter variability due to factors such as temperature. In contrast, polar modulation may allow the use of very efficient and non-linear amplifier designs for non-constant envelope modulation schemes.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for polar modulation using a direct digital frequency synthesizer, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for polar modulation using a direct digital frequency synthesizer. Exemplary aspects of the invention include generating a phase modulated signal in a DDFS, amplitude modulating the generated phase modulated signal in a non-linear device and transmitting the signal via a wireless medium. A processor may control the generation of the phase and amplitude modulated signals. The non-linear device may comprise a non-linear power amplifier or a mixer. The method may also comprise generating a first phase modulated signal in a first DDFS and generating a second phase modulated signal in a second DDFS, or in a single DDFS with two integrated digital-to-analog converters, and upconverting and combining the first and second phase modulated signals and amplitude modulating the combined upconverted signals in a non-linear device. A processor may control the generation of the first and second phase modulated signals.

Figure 1A:
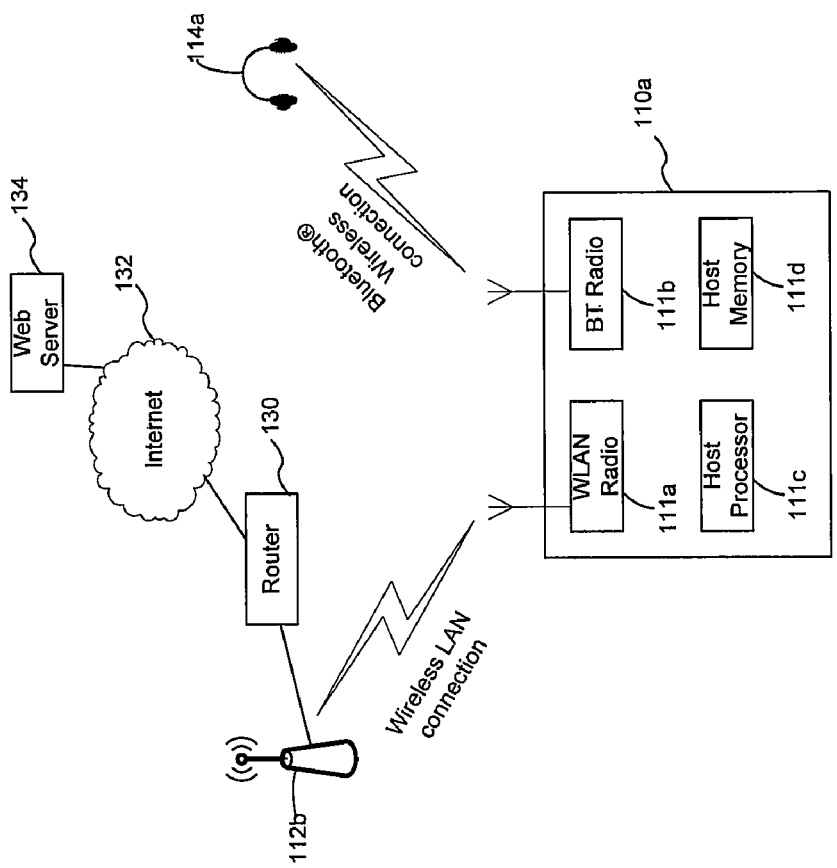
FIG. 1A is a diagram illustrating an exemplary WLAN and Bluetooth® wireless communication system, in connection with an embodiment of the invention.

FIG. 1A is a diagram illustrating an exemplary WLAN and Bluetooth® wireless communication system, in connection with an embodiment of the invention. Referring to FIG. 1, there is shown a WLAN access point 112b, a computer 110a, a Bluetooth® headset 114a, a router 130, the Internet 132 and a web server 134. The computer or host device 110a may comprise a wireless LAN (WLAN) radio 111a, a Bluetooth® radio 111b, a host processor 111c, and a host memory 111d. There is also shown a Wireless LAN (WLAN) connection between the wireless LAN radio 111a and the wireless LAN access point 112b, and a Bluetooth® wireless connection between the Bluetooth® radio 111b and the Bluetooth® headset 114a.

Frequently, computing and communication devices may comprise hardware and software to communicate using multiple wireless communication standards. The WLAN radio 111a may be compliant with IEEE 802.11 standard. There may be instances when the WLAN radio 111a and the Bluetooth® radio 111b are active concurrently. For example, it may be desirable for a user of the computer or host device 110a to access the Internet 132 in order to consume streaming content from the Web server 134. Accordingly, the user may establish a WLAN connection between the computer 110a and the access point 112b. Once this connection is established, the streaming content from the Web server 134 may be received via the router 130, the access point 112b, and the WLAN connection, and consumed by the computer or host device 110a.

It may be further desirable for the user of the computer 110a to listen to an audio portion of the streaming content on the Bluetooth® headset 114a. Accordingly, the user of the computer 110a may establish a Bluetooth® wireless connection with the Bluetooth® headset 114a. Once the Bluetooth® wireless connection is established, and with suitable configurations on the computer enabled, the audio portion of the streaming content may be consumed by the Bluetooth® headset 114a.

Figure 1B:
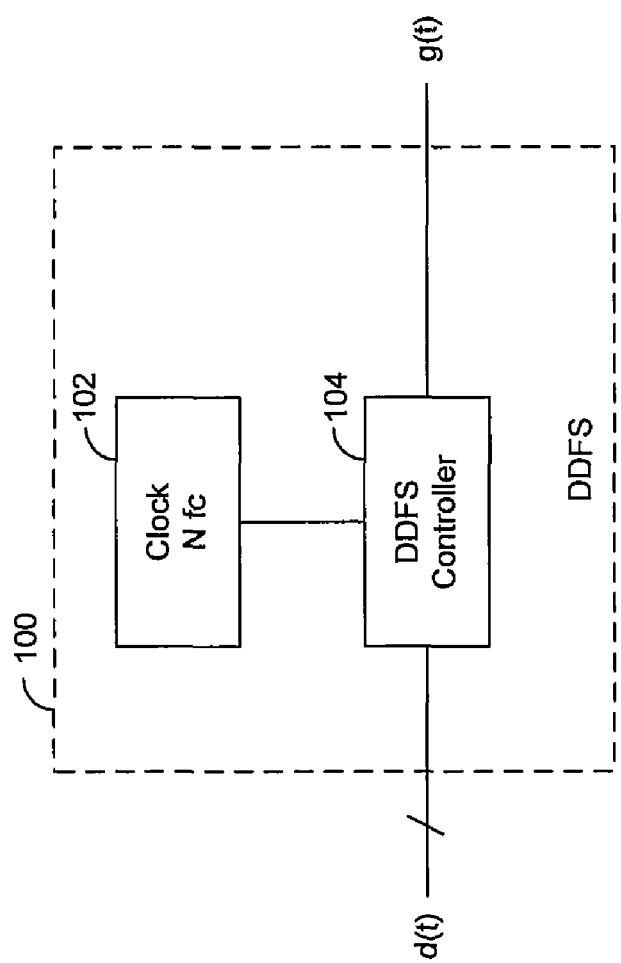
FIG. 1B is a block diagram illustrating an exemplary Direct Digital Frequency Synthesizer (DDFS), in connection with an embodiment of the invention.

FIG. 1B is a block diagram illustrating an exemplary Direct Digital Frequency Synthesizer (DDFS), in connection with an embodiment of the invention. Referring to FIG. 1B, there is shown a DDFS 100, a clock 102 and a DDFS controller 104. There is also shown a digital input signal d(t) and an analog output signal g(t).

The DDFS 100 may be a digitally-controlled signal generator that may vary the analog output signal g(t) over a large range of frequencies, based on a single fixed-frequency precision reference clock, which may be clock 102. In addition, the DDFS 100 may also be phase-tunable. The digital input signal d(t) may comprise control information about the frequency and/or phase of the analog output signal g(t) that may be generated as a function of the digital input signal d(t). The clock 102 may provide a reference clock that may be N times higher than the frequency $f_c$ that may be generated at the output signal g(t). Using the clock 102 and the information that may be contained in the digital input signal d(t), the DDFS controller 104 may generate a variable frequency analog output signal g(t). The DDFS 100 may be fabricated utilizing a deep submicron process such as a 45 nanometer (nm) deep submicron process. The 45 nanometer (nm) deep submicron process may be a 45 nanometer (nm) deep submicron CMOS process. In this regard, the DDFS 100 may be enabled to generate high frequency signals that may facilitate polar modulation.

Figure 2A:
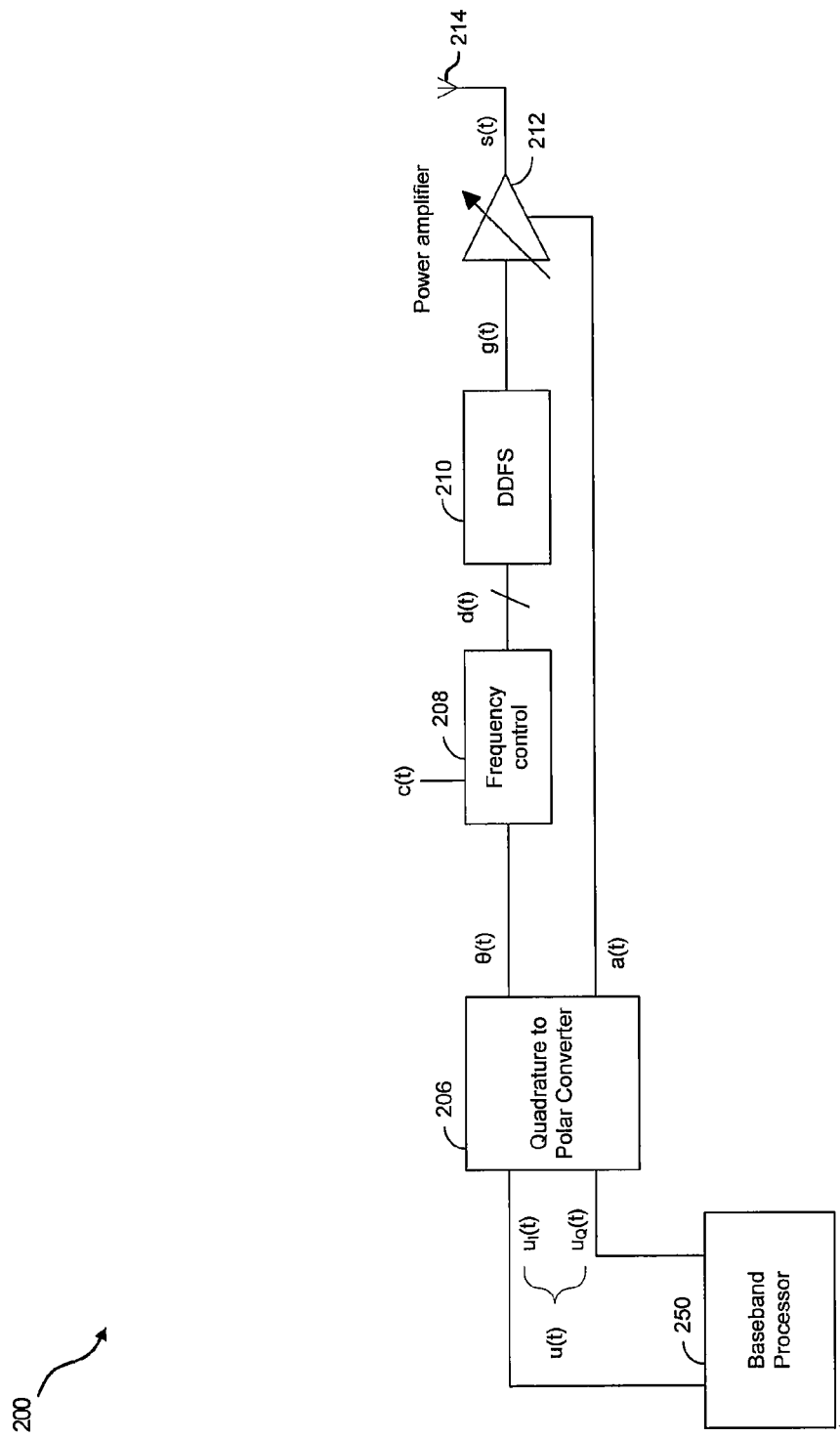
FIG. 2 is a block diagram illustrating an exemplary polar transmission system using DDFS, in accordance with an embodiment of the invention.

FIG. 2A is a block diagram illustrating an exemplary polar transmission system using DDFS, in accordance with an embodiment of the invention. Referring to FIG. 2A, there is shown a polar transmission system 200, comprising a baseband processor 250, a Quadrature-to-Polar (Q2P) converter 206, a frequency control block 208, a DDFS 210, a power amplifier 212 and an antenna 214. There is also shown a complex envelope signal $u(t)=u_I(t)+j\, u_Q(t)$, comprising an inphase component $u_I(t)$ and a quadrature component $u_Q(t)$, a phase θ(t), an amplitude a(t), a frequency control signal c(t), a digital DDFS control signal d(t), a DDFS output signal g(t), and a transmit signal s(t).

The baseband processor 250 may comprise suitable circuitry, logic and/or code that may be enabled to generate baseband signals for a wireless communication system. Some communication systems may process and modulate the quadrature component $u_Q(t)$ and the inphase component $u_I(t)$ of the complex envelope u(t) separately. For non-constant envelope modulation methods, however, it may be useful to use polar modulation in conjunction with a DDFS. Polar modulation may allow combining the inphase and quadrature components such that amplitude modulation and phase modulation for the complex envelope may be achieved by phase modulation followed by amplitude modulation or vice versa. The ability to sequentially modulate amplitude and phase may avoid a need for high quality linear power amplifiers as may be desirable in more common inphase and quadrature modulation, in particular for non-constant envelope modulation.

Due to modern semiconductor manufacturing methods that may permit ever increasing processing speeds, the DDFS may be able to modulate a signal directly from baseband to radio frequency without modulating to intermediate frequency first. For example, 45 nm and smaller semiconductor processes may be able to operate DDFS at frequencies of 60 GHz and higher. The DDFS may also be able to achieve near instantaneous frequency and phase shifts over a large frequency range while maintaining a phase-continuous signal. This approach may be particularly appropriate for polar modulation of frequency-hopping signals such as, for example, Orthogonal Frequency Division Multiplexing (OFDM).

In order to use polar modulation, the complex envelope signal u(t), which may also be referred to as a complex low pass equivalent signal, may be converted into polar form in the Q2P converter 206. The phase θ(t) and the amplitude a(t) may be obtained from u(t) through the following relationships:

$$a(t) = \sqrt{u_I^2(t) + u_Q^2(t)}$$

and $$\theta(t) = \tan^{-1}\left(\frac{u_Q(t)}{u_I(t)}\right)$$

So that $u(t)=a(t)e^{j\theta(t)}$. The transmitted signal, after frequency modulation may be given by the following relationship:

$$s(t)=Re\{u(t)e^{j2\pi f_C(t)t}\}=a(t)\cos(2\pi f_C(t)t+\theta(t)) \tag{1}$$

where $f_C(t)=c(t)f$ may be a time-varying carrier. The frequency $f_C(t)$ may be time varying, for example, because of frequency hopping, and the frequency hopping sequence may be controlled by the frequency control signal c(t). The frequency f may be a constant frequency. In the manner shown in equation (1), the modulation of the complex envelope signal u(t) may be achieved in a step comprising carrier and phase modulation and another step comprising amplitude modulation. The carrier and phase modulation may be achieved in DDFS 210 and the amplitude modulation in power amplifier 212.

The frequency control block 208 may receive as inputs the phase θ(t) and the frequency control signal c(t). The frequency control block 208 may generate a digital signal d(t) that may feed the DDFS and may provide information about the phase θ(t) and the frequency control signal c(t) to the DDFS in a digital format so that the DDFS 210 may generate the analog output signal g(t), where $$g(t)=\cos(2\pi f_C(t)t+\theta(t))$$

The power amplifier 212 may perform amplitude modulation on the signal g(t) to generate the transmit signal s(t), where $$s(t)=a(t)g(t)$$

The signal s(t) may then be transmitted via antenna 214.

Figure 2B:
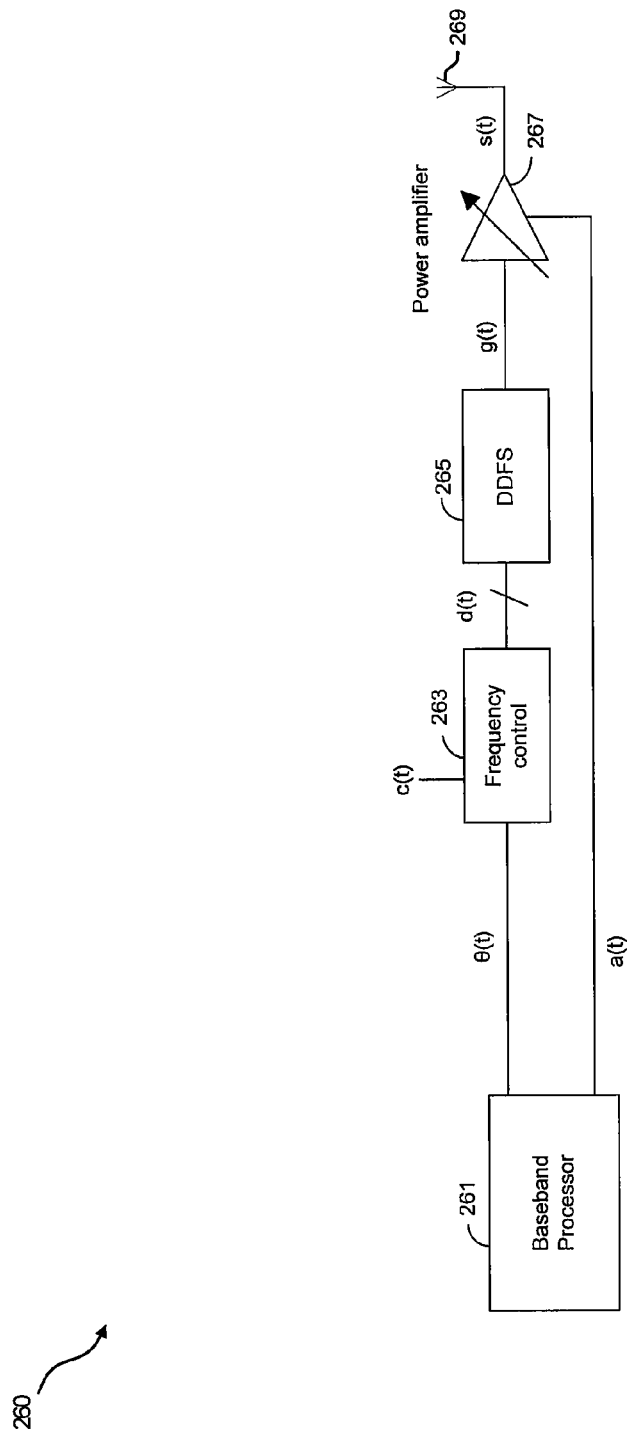

FIG. 2B is a block diagram illustrating an exemplary polar transmission system using DDFS, in accordance with an embodiment of the invention. Referring to FIG. 2B, there is shown a polar transmission system 260, comprising a baseband processor 261, a frequency control block 263, a DDFS 265, a power amplifier 267 and an antenna 269. There is also shown a phase θ(t), an amplitude a(t), a frequency control signal c(t), a digital DDFS control signal d(t), a DDFS output signal g(t), and a transmit signal s(t).

The frequency control block 263, the DDFS 265, the power amplifier 267 and the antenna 269 may be substantially similar to the frequency control block 208, the DDFS 210, the power amplifier 212 and the antenna 214 described with respect to FIG. 2A. The baseband processor may be substantially similar to the baseband processor 250 described with respect to FIG. 2A, but may generate the polar amplitude a(t) and phase θ(t) signals directly, as opposed to the embodiment described with respect to FIG. 2A, wherein the baseband processor 250 may generate inphase and quadrature signals that may then be converted to polar amplitude a(t) and phase θ(t) signals utilizing the Q2P converter 206.

In operation, the phase signal θ(t), may be communicated to the frequency control block. The frequency control block 263 may receive as inputs the phase θ(t) and the frequency control signal c(t). The frequency control block 263 may generate a digital signal d(t) that may feed the DDFS 265 and may provide information about the phase θ(t) and the frequency control signal c(t) to the DDFS 265 in a digital format so that the DDFS 265 may generate the analog output signal g(t), where $$g(t)=\cos(2\pi f_C(t)t+\theta(t))$$

The power amplifier 267 may perform amplitude modulation on the signal g(t) to generate the transmit signal s(t), where $$s(t)=a(t)g(t)$$

The signal s(t) may then be transmitted via antenna 269.

Figure 3:
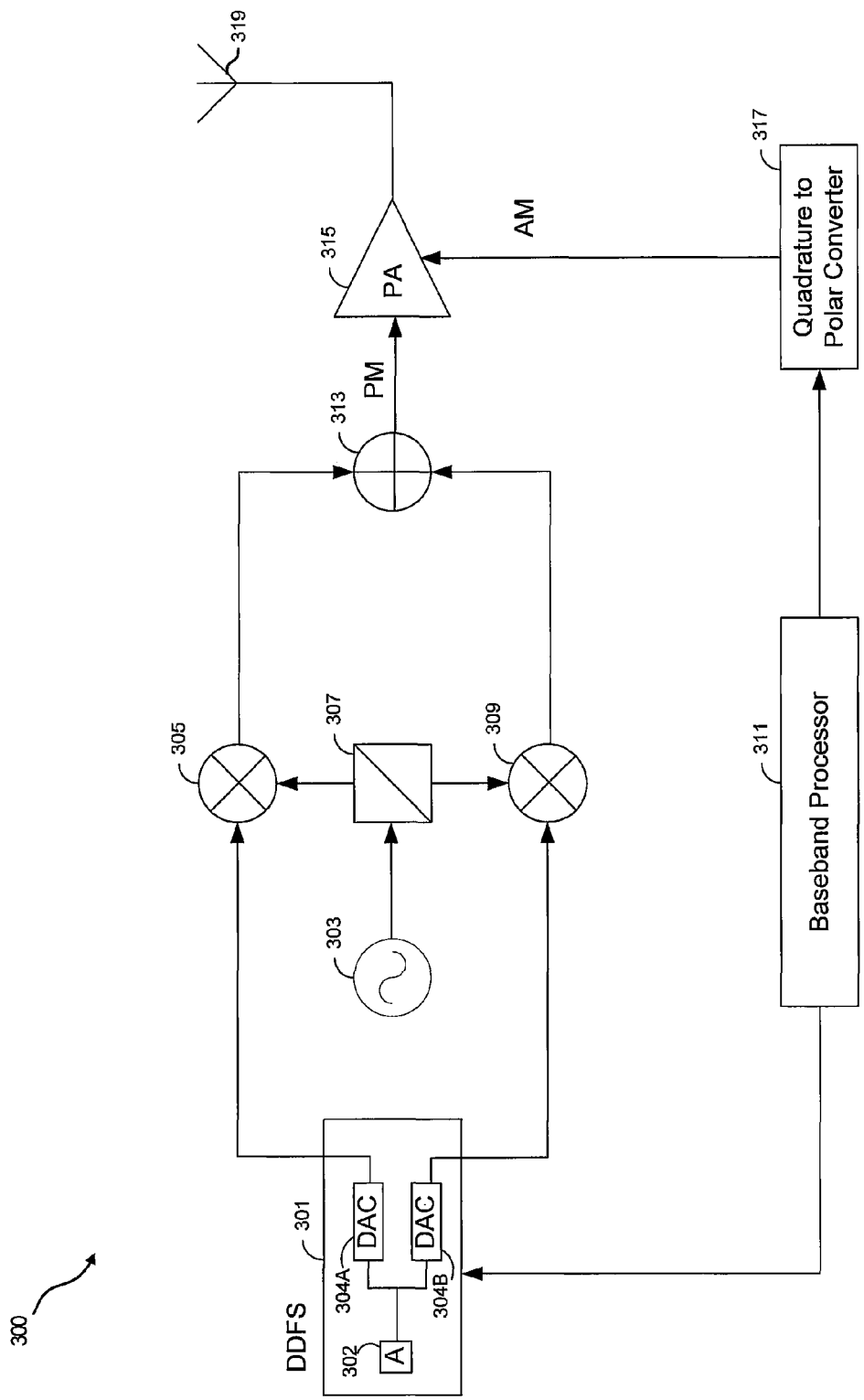
FIG. 3 is a block diagram illustrating an exemplary polar transmission system using DDFS and mixers, in accordance with an embodiment of the invention.

FIG. 3 is a block diagram illustrating an exemplary polar transmission system using DDFS and mixers, in accordance with an embodiment of the invention. Referring to FIG. 3, there is shown a polar transmission system 300 comprising a DDFS 301, a local oscillator (LO) 303, mixers 305 and 309, a phase shifter 307, a baseband processor 311, an adder 313, a power amplifier 315, a Q2P converter 317 and an antenna 319. The DDFS 301 may comprise suitable circuitry, logic and/or code for generating a signal or signals at selectable frequencies. The DDFS 301 may include an accumulator 302 and DACs 304A and 304B. The accumulator 302 may comprise suitable circuitry, logic and/or code that may be enabled to generate a digital signal at a programmable frequency. The DACs 304A and 304B may comprise suitable circuitry, logic and/or code that may be enabled to convert a digital signal to an analog signal. In another embodiment of the invention, the DDFS 301 may comprise two separate DDFSs to generate the output signals, described further with respect to FIG. 4. The baseband processor 311 may comprise suitable circuitry, logic and/or code that may be enabled to generate inphase and quadrature baseband signals for a wireless communication system. Accordingly, the baseband processor 311 may be enabled to control the DDFS 301 for phase modulation and may also be enabled to control the Q2P converter 317 for amplitude modulation.

The LO 303 may comprise suitable circuitry, logic and/or code that may be enabled to generate a signal at a specific frequency. The LO 303 may comprise a voltage-controlled oscillator or a crystal oscillator, for example, and may be coupled to a phase shifter 307. The phase shifter 307 may comprise suitable circuitry, logic and/or code that may be enabled to generate output signals that are either in-phase with a received signal, or 90 degrees out of phase with the received signal, thus resulting in a sine output and a cosine output, which may be utilized to generate an I and Q signal.

The mixers 305 and 309 may comprise suitable circuitry, logic and/or code that may be enabled to up-convert the frequency of a received signal at a frequency that may be equal to the sum of the received signal and that of another input signal. The adder 313 may comprise suitable circuitry, logic and/or code that may be enabled to generate an output signal that may be the sum of signals received at its inputs. The adder 313 may receive as inputs, signals generated by the mixers 305 and 309. The power amplifier 315 and the antenna 319 may be substantially similar to the power amplifier 212 and the antenna 214 described with respect to FIG. 2A In operation, the DDFS 301 may generate intermediate frequency output signals that may be communicated to the mixers 305 and 309. The signals may comprise inphase and quadrature signals. The LO 303 may generate a signal at an intermediate frequency that may be communicated to an input of the mixer 305, and may also be phase-shifted by 90 degrees by the phase shifter 307 and communicated to an input of the mixer 309. The mixers 305 and 309 may generate output signals that may be at an RF frequency defined by the sum of the frequencies of the received input signals, namely the output signals generated by the DDFS 301 and the LO 303 via the phase shifter 307. The outputs of the mixers 305 and 309 may be summed by the adder 313 and then communicatively coupled to the power amplifier 315. The signal generated at the output of the adder 313 may comprise the polar phase modulation PM signal of the polar transmission system 300. In other words, the inphase and quadrature component signals generated by the DDFS 301 may be upconverted and summed so as to generate the phase signal, the latter of which may be utilized for the polar construction. During upconversion of the inphase and quadrature components, a phase of one of these components may be shifted 90 degrees with respect to the other.

The amplitude modulated signal for the polar transmission system 300 may comprise the output of the Q2P converter 317 driven by the baseband processor 311. The phase modulation PM and the amplitude modulation AM signals may be mixed and amplified by the power amplifier 315 for transmission to a wireless media by the antenna 319. In another embodiment of the invention, the power amplifier 315 may comprise a mixer.

Figure 4:
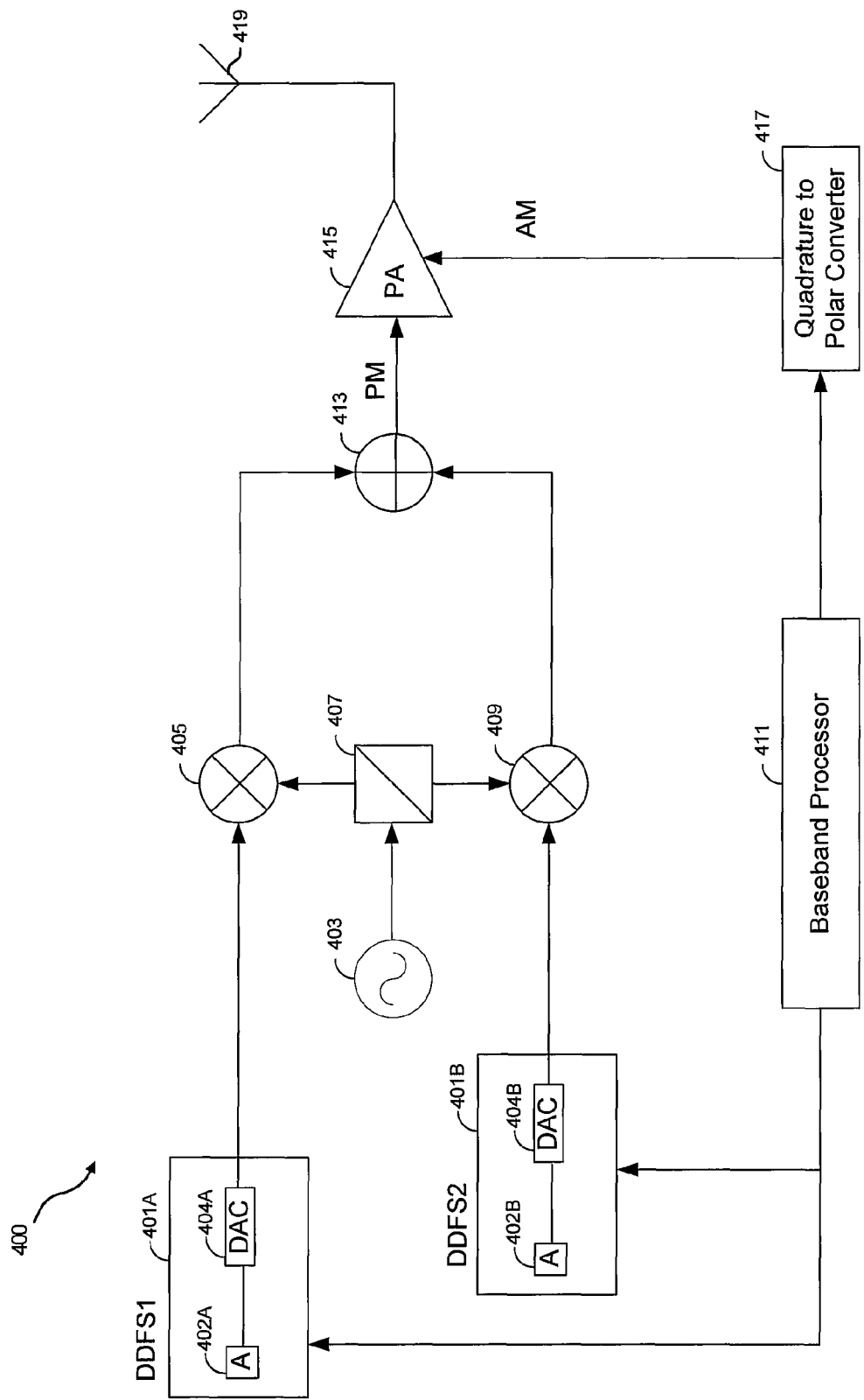
FIG. 4 is a block diagram illustrating an exemplary polar transmission system using DDFS and mixers, in accordance with an embodiment of the invention.

FIG. 4 is a block diagram illustrating an exemplary polar transmission system using DDFS and mixers, in accordance with an embodiment of the invention. Referring to FIG. 4, there is shown a polar transmission system 400 comprising DDFSs 401A and 401B, a local oscillator (LO) 403, mixers 405 and 409, a phase shifter 407, a baseband processor 411, an adder 413, a power amplifier 415, a Q2P converter 417 and an antenna 419. The local oscillator (LO) 403, the mixers 405 and 409, the phase shifter 407, the baseband processor 411, the adder 413, the power amplifier 415, the Q2P converter 417 and the antenna 419 may be substantially similar to the same components described with respect to FIG. 3, and coupled in the same manner. The DDFSs 401A and 401B may be substantially similar to the DDFS 301, except that the DDFS 401A may include a single DAC 404A and the DDFS 401B may include a single DAC 404B, and may thus each generate a single output signal. The accumulators 402A and 402B may be substantially similar to the accumulator 302 and the DACs 404A and 404B may be substantially similar to the DACs 304A and 304B, described with respect to FIG. 3 The output of the DDFS 401A may be coupled to an input of the mixer 405, and the output of the DDFS 401B may be coupled to an input of the mixer 409.

In operation, the DDFS 401A may generate an intermediate frequency output signal that may be communicated to the mixer 405, and the DDFS 401B may generate an intermediate frequency output signal that may be communicated to the mixer 409. The signals may comprise inphase and quadrature signals. The LO 403 may generate a signal at an intermediate frequency that may be communicated to an input of the mixer 405, and may also be phase-shifted by 90 degrees by the phase shifter 407 and communicated to an input of the mixer 409. The mixers 405 and 409 may generate output signals that may be at an RF frequency defined by the sum of the frequencies of the received input signals, namely the output signals generated by the DDFSs 401A and 401B and the LO 403 via the phase shifter 407. The outputs of the mixers 405 and 409 may be summed by the adder 413 and then communicatively coupled to the power amplifier 415. The signal generated at the output of the adder 413 may comprise the polar phase modulation PM signal of the polar transmission system 400. In other words, the inphase and quadrature component signals generated by the DDFSs 401A and 401B may be upconverted and summed so as to generate the phase signal, the latter of which may be utilized for the polar construction. During upconversion of the inphase and quadrature components, a phase of one of these components may be shifted 90 degrees with respect to the other.

The amplitude modulated signal for the polar transmission system 400 may comprise the output of the Q2P converter 417 driven by the baseband processor 411. The phase modulation PM and the amplitude modulation AM signals may be mixed and amplified by the power amplifier 415 for transmission to a wireless media by the antenna 419. In another embodiment of the invention, the power amplifier 415 may comprise a mixer.

Figure 5:
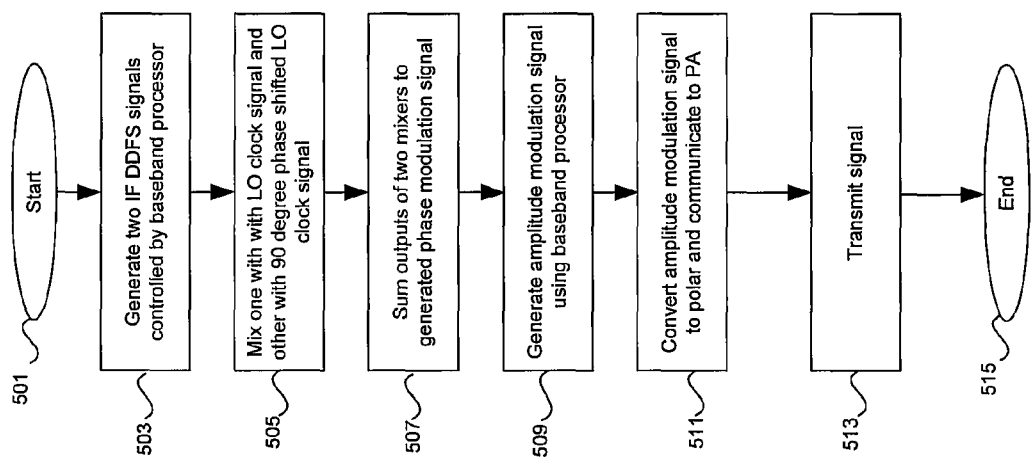
FIG. 5 is a flow diagram illustrating exemplary steps in the control of a polar modulator utilizing a DDFS.

FIG. 5 is a flow diagram illustrating exemplary steps in the control of a polar modulator utilizing a DDFS. Referring to FIG. 5, in step 503, two DDFS signals may be generated, either by a single DDFS 301 with two output signals, or two DDFSs 401A and 401B controlled by a baseband processor 311 or 411, respectively. In step 505, a LO 403 signal may be mixed with a DDFS 401B signal, and a 90 degree phase shifted LO 403 signal may be mixed with a DDFS 401A output. In step 507, the outputs of the two mixers 405 and 409 may be summed by the adder 413 to generate a phase modulation signal. In step 509, an amplitude modulation signal may be generated by the baseband processor 411, and in step 511, the amplitude modulation signal may be converted to polar by the Q2P converter 417 and communicated to the PA 415. In step 513, the polar signal generated by mixing the phase and amplitude modulated signals via the PA 415 may be transmitted by the antenna 419.

In an embodiment of the invention, a phase modulated signal may be generated in a DDFS 210, amplitude modulated in a non-linear device 212 and transmitted via a wireless medium. A processor 261 may control the generation of the phase and amplitude modulated signals. The non-linear device may comprise a non-linear power amplifier 267 or a mixer. The modulated intermediate frequency signals may be upconverted to corresponding one or more RF signals. The intermediate frequency signals may be amplitude modulated. The modulated intermediate frequency signals may be frequency modulated and the RF signals may be amplitude modulated.

In another embodiment of the invention, a first phase-modulated signal may be generated in a first DDFS and a second phase modulated signal may be generated in a second DDFS, or in a single DDFS 301 comprising two integrated digital-to-analog converters. The first and second phase modulated signals may be upconverted and combined. The resulting combined upconverted signals may be amplitude modulated in a non-linear device such as, for example, a linear amplifier and/or a mixer. A processor 311 may be enabled to control the generation of the first and second phase modulated signals.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:
   generating a first phase modulated intermediate frequency signal and a second phase modulated intermediate frequency signal in a direct digital frequency synthesizer (DDFS)
   frequency modulating, by said DDFS, said generated first phase modulated intermediate frequency signal and said second phase modulated intermediate frequency signal;
   upconverting said generated first phase and frequency modulated intermediate frequency signal and second phase and frequency modulated intermediate frequency signal;
   combining said upconverted first phase and frequency modulated intermediate frequency signal and said second phase and frequency modulated intermediate frequency signal; and
   amplitude modulating said combined upconverted first phase and frequency modulated intermediate frequency signal and said second phase and frequency modulated intermediate frequency signal in a non-linear device.

2. The method according to claim 1, comprising transmitting said amplitude modulated signal via a wireless medium.

3. The method according to claim 1, comprising controlling said generating of said first phase modulated signal and second phase modulated signal via a processor.

4. The method according to claim 1, comprising controlling said amplitude modulating of said combined upconverted phase modulated signal via a processor.

5. The method according to claim 1, wherein said non-linear device is a non-linear power amplifier.

6. The method according to claim 1, wherein said non-linear device is a mixer.

7. The method according to claim 1, comprising amplitude modulating said generated one or more modulated intermediate frequency signals.

8. The method according to claim 1, comprising amplitude modulating one or more corresponding RF signals that are generated from said upconversion of said generated first phase modulated intermediate frequency signal and said second phase modulated intermediate frequency signal.

9. A system for processing signals, the system comprising:
   one or more circuits comprising a direct digital frequency synthesizer (DDFS), a processor and a non-linear device, wherein:
   said DDFS enables generation of a first phase modulated intermediate frequency signal and a second phase modulated intermediate frequency signal;
   said one or more circuits is operable to frequency modulate said generated phase modulated intermediate frequency signals by said DDFS;
   said one or more circuits upconvert said first and second phase and frequency modulated intermediate frequency signals;
   said one or more circuits combine said upconverted phase and frequency modulated signals; and
   said non-linear device enables amplitude modulation of said combined upconverted phase and frequency modulated signal.

10. The system according to claim 9, wherein said more or more circuits transmits said amplitude modulated signal via a wireless medium.

11. The system according to claim 9, wherein said processor controls said generation of said first phase modulated signal and said second phase modulated signal.

12. The system according to claim 9, wherein said processor controls said amplitude modulation of said combined upconverted phase modulated signal.

13. The system according to claim 9, wherein said non-linear device comprises a non-linear power amplifier.

14. The system according to claim 9, wherein said non-linear device comprises a mixer.

15. The system according to claim 9, wherein said more or more circuits enables amplitude modulation of said generated one or more modulated intermediate frequency signals.

16. The system according to claim 9, wherein said more or more circuits enable amplitude modulation of said corresponding one or more RF signals.

17. A method for processing signals, the method comprising: generating a first phase modulated intermediate frequency signal in a first direct digital frequency synthesizer (DDFS);
   generating a second phase modulated intermediate frequency signal in a second DDFS; frequency modulating said generated phase modulated intermediate frequency signals by said first and second DDFS;
   upconverting said generated first and second phase and frequency modulated intermediate frequency signals; combining said upconverted phase and frequency modulated signals; and amplitude modulating said combined upconverted phase and frequency modulated signals in a non-linear device.

18. The method according to claim 17, comprising transmitting said amplitude modulated signal via a wireless medium.

19. The method according to claim 17, comprising controlling said generating of said first and second phase modulated signals via a processor.

20. The method according to claim 17, comprising controlling said amplitude modulating of said combined upconverted signals via a processor.

21. The method according to claim 17, wherein said non-linear device is a non-linear power amplifier.

22. The method according to claim 17, wherein said non-linear device is a mixer.

23. The method according to claim 17, comprising generating said second phase modulated signal in said first DDFS, wherein a first digital-to-analog converter (DAC) integrated within said first DDFS is used for generating said first phase modulated signal and a second DAC integrated within said first DDFS is used for generating said second phase modulated signal.

24. A system for processing signals, the system comprising one or more circuits comprising: a first direct digital frequency synthesizer (DDFS) comprising a first digital-to-analog converter (DAC) and a second digital-to-analog converter (DAC), a second DDFS, a plurality of mixers, an adder, a processor, and a non-linear device, wherein:
- said first DDFS enables generation of a first phase modulated intermediate frequency signal;
- said second DDFS enables generation of a second phase modulated intermediate frequency signal;
- said one or more circuits is operable to frequency modulate said generated phase modulated intermediate frequency signals by said first and second DDFS;
- said plurality of mixers enables upconversion of said generated first and second frequency and phase modulated intermediate frequency signals;
- said adder enables combination of said upconverted frequency and phase modulated signals; and
- said non-linear device enables amplitude modulation of said combined upconverted frequency and phase modulated signals.

25. The system according to claim 24, wherein said one or more circuits enables transmission of said amplitude modulated signal via a wireless medium via one or more antennas.

26. The system according to claim 24, wherein said processor enables control of said generation of said first and second phase modulated signals.

27. The system according to claim 24, wherein said processor enables control of said amplitude modulation of said combined upconverted signals.

28. The system according to claim 24, wherein said non-linear device comprises a non-linear power amplifier.

29. The system according to claim 24, wherein said non-linear device comprises a mixer.

30. The system according to claim 24, wherein said first DDFS enables generation of said second phase modulated signal by using said first digital-to-analog converter (DAC) for generation of said first phase modulated signal and said second DAC for generation of said second phase modulated signal.

* * * * *